United States Patent [19]

Gaehde et al.

[11] 4,005,238

[45] Jan. 25, 1977

[54] METALLIZED ARTICLES AND METHOD OF PRODUCING THE SAME

[75] Inventors: Joachim Gaehde; Adolf Gesierich; Ingrid Loeschcke, all of Berlin, Germany

[73] Assignee: Akademie der Wissenschaften der DDR, Berlin-Adlershof, Germany

[22] Filed: Mar. 10, 1975

[21] Appl. No.: 556,770

Related U.S. Application Data

[63] Continuation-in-part of Ser. No. 514,702, Oct. 15, 1974, abandoned.

[30] Foreign Application Priority Data

Oct. 25, 1973 Germany .......................... 174378

[52] U.S. Cl. ............................. 428/313; 427/250; 427/373; 427/404; 427/407 C; 427/407 G; 428/315; 428/412; 428/424; 428/458; 428/460; 428/461; 428/474; 428/501; 428/522; 428/524; 428/480
[51] Int. Cl.² .................... B32B 5/18; B37B 15/08
[58] Field of Search ........... 161/159, 213; 428/457, 428/313, 424, 412, 310, 315, 458, 460, 461, 524, 474, 522, 501, 480; 117/71 R, 47 A; 427/245, 246, 404, 373, 407 C, 407 G, 250, 430

[56] References Cited

UNITED STATES PATENTS

| 3,116,159 | 12/1963 | Fisher | 117/71 R |
|---|---|---|---|
| 3,156,659 | 11/1964 | Robitschek | 161/213 |
| 3,305,460 | 2/1967 | Lacy | 117/71 R |
| 3,467,540 | 9/1969 | Schick | 117/47 A |
| 3,544,432 | 12/1970 | Ishii | 117/47 A |
| 3,677,792 | 7/1972 | Best | 161/213 |
| 3,691,007 | 9/1972 | Pavlow | 161/213 |
| 3,729,536 | 4/1973 | Warwicker | 161/159 |
| 3,839,129 | 10/1974 | Neumann | 161/213 |

OTHER PUBLICATIONS

H. Rushland, et. al., "Poly(ethylene terephthalate)–based hot–melt adhesives", Chem. Abstracts, vol. 80, 84060g, 1974.

*Primary Examiner*—George F. Lesmes
*Assistant Examiner*—Ellis P. Robinson
*Attorney, Agent, or Firm*—Nolte and Nolte

[57] ABSTRACT

A metallized polymeric article in which the metal coating is more firmly adhered is provided by disposing between the polymeric substrate and the metal top coat a poromeric adhesive coating. The poromeric adhesive coating is produced by coating onto the substrate a solution or dispersion of a polymer which when coagulated by exposure to an atmosphere of a suitably high relative humidity coagulates to form a poromeric adhesive coating.

8 Claims, No Drawings

METALLIZED ARTICLES AND METHOD OF PRODUCING THE SAME

This is a continuation-in-part of application Ser. No. 514,702, filed Oct. 15, 1974, now abandoned.

This invention relates to metallized articles in the form of plates, foils, bands, sections and the like of thermoplastic polymer materials such as polyethylene terephthalate, polymethylmethacrylate, polyurethanes, polyamides, polyolefins and polycarbonates, or thermostable polymers, such as polyquinoxaline, an adhesive polymer layer, and a top metal coat on the polymer material, having an improved adherence of the top metal coat to the polymer material, as well as to a method for the production of the metallized bodies.

It is known to coat polymers by vacuum vaporization or by reductive deposition from metal salt solutions, which generally require multistage methods, with a top metal coat which imparts to the coated polymer such properties as high surface conductivity, opacity, reflectivity of heat rays, surface hardness and a metallic appearance.

The service properties of these polymer-metal composites depend both on the properties of the individual components of the composites and on the strength of the adhesion of the top metal coat to the polymer material. In order to improve the adhesive strength, the surface of the polymer material either is roughened by known physical methods, for example, sandblasting, or prepared by chemical treatment in such a way that it permits extensive mechanical anchoring of the metal onto the polymer material, similarly to the so-called press fastener principle described in connection with ABS polymers.

For roughening of the surface of the polymer material by chemical means, components of the polymer material are dissolved out of the surface by the action of organic solvents, for example acetone, or of acids, for example sulfuric acid, hydrochloric acid, trichloroacetic acid, chromosulfuric acid, and/or of alkaline agents, such as aqueous or alcoholic sodium hydroxide, alkaline hydrazine hydrate solution. In another method, the polymer material is treated with a dissolved metal salt complex in the presence of a solvent which dissolves or partially dissolves or partially swells the polymer.

Each chemical roughening or etching process is followed by sensitization of the polymer material, preferably with tin (II) chloride, and, thereafter, activation of the polymer material by the action of noble metal salt solutions, for example, by using palladium chloride or silver nitrate in ionized or colloidal form. These prepared materials can then be provided, galvanically by copper plating without external current, with the top metal coat, or with additional coats, if necessary.

A particular disadvantage of all the above mentioned etching methods is that by dissolving individual components out of the surface of the polymer material, its mechanical properties, particularly when it has a high surface to volume ratio, as in the case, for example, of bands or foils, drop to such an extent that the value of these methods seems doubtful for technical utilization. Furthermore it seems desirable to improve the strength of the adhesive bond between the top metal coat and the polymer material, which amounts to only about H 1 Newton/6.5mm. when fabrication is according to the conventional methods (1 newton = 0.225 pounds).

A number of other methods use bonding agents or adhesives to improve the strength of the adhesive bond between the metal and the polymer material. Examples of the bonding agents or adhesives are copolymers of acrylamide and/or methacrylamide and polyvinyl butyrate or of vinylidene chloride and acrylonitrile or a polyester of ethylene glycol, terephthalic acid and isophthalic acid or polyurethanes made from a polyester-based polyurethane prepolymer and a polyisocyanate. The bonding agents or adhesives are applied onto the polymeric material in the form of dispersions or solutions by dipping or spraying. Bonding agent or adhesive compositions are either mixed with finely powdered metals, such as aluminum, copper or silver, before they are applied or the finely powdered metals are sprayed on the still wet surface after the bonding agent or adhesive composition has been applied, or collodial metals, such as palladium, are deposited onto the polymeric material substrate from their noble metal salt solutions by reduction. These metal deposits permit both a subsequent metallization of the polymeric material by galvanic means or the currentless deposition of additional metallic materials onto the polymeric material substrate in a metallizing bath. If a polyurethane bonding agent layer is used, which after drying at 90° C. is in the form of a compact, transparent film, similar to the other above mentioned bonding agents, the metal coating is effected with aluminum or silver, for example, preferably by means of the vacuum vaporization technique. Such metal coated polymer materials which are characterized by a large surface to volume ratio, such as bands and foils, are found to be to some extent highly pressure sensitive and the metal coatings tend to peel off or crack, due to the low adhesive strength of the top metal coat on the polymer material.

The great number of methods for attempting to improve the adhesive strength of metals on polymer materials illustrates the great importance which is attributed by those skilled in the art to this processing stage in the production of metallized polymer materials, and the lack of or limited success of those methods makes it, on the other hand, desirable to search for additional methods for improving the adhesive strength of the top metal coat on the polymer material.

It is an object of this invention to produce metallized bodies in the form of plates, foils, bands and other shapes constituted of thermoplastic polymer materials, such as polyethylene terephthalate, polymethylmethacrylate, polyurethanes, polyamides, polyolefins, polycarbonates, or thermostable polymer materials, such as polyquinoxaline, a polymeric adhesive layer and a top metal coat, having an improved adhesive strength of the top metal coat on the polymer material. It is another object of the invention to provide a method for production of the metallized bodies by one- or multi-sided coating of the polymer materials to be metallized with a polymeric adhesive coating and subsequent metallization. Other objects and advantages of the invention will be apparent to those skilled in the art from the following description of the invention.

According to the invention, the polymeric adhesive layer between the polymer material and the top metal coat is a poromer layer. This is achieved by coating the bodies to be metallized with a solution and/or dispersion of a polymer tending to coagulate in a wet atmosphere and subsequently coagulating the coating to form a poromeric adhesive layer. Provided that the relative humidity, calculated at normal atmospheric pressure, of the atmosphere is above 40%, preferably above 65%, the microporosity of the poromeric layer may be regulated in dependence upon the relative humidity and temperature of the atmosphere during the coagulation.

Suitable polymers for the formation of the poromeric adhesive layer are particularly polyurethane polymers, for example based on a polyester of 2200 molecular weight with diphenylmethane diisocyanate and diaminodiphenyl methane as chain extenders, linear low molecular weight polyesters based on polyethylene terephthalate and preferably having an average molecular weight of 20,000 to 60,000, and polyvinyl formal having a molecular weight of about 100,000.

In the case of a multi-sided coating, the method is preferably carried out by dipping the polymer material body in a 5 to 20%, by weight, solution of the polymeric coating material in dimethyl formamide or in a dimethylformamide-acetone mixture or in a 5 to 20%, by weight, dispersion of the polymeric coating material in a mixture of a halogenated hydrocarbon, for example, dichloroethane, and dimethylformamide, and in the case of a one-sided coating, the method is preferably carried out by brushing the polymer material body with the above mentioned dissolved or dispersed polymeric coating material. Subsequently the coated polymer material is brought into a so-called drying duct for the formation of the poromeric adhesive layer. Into this duct is injected humidified air having a relative humidity above 40%, preferably above 65%, calculated at normal atmospheric pressure, and a temperature of about 23° to 30° C. The moisture in the air leads to the coagulation of the polymeric coating material on the polymer material body and effects at the same time the formation of poromeric gel structures which are fixed by washing with water at a temperature below 50° C. to completely eliminate the solvent. Subsequent drying at temperatures above 50° C. yields a polymer material coated with a poromeric adhesive layer the surface of which is not tacky and has a milky opaque appearance.

The top metal coat is preferably zinc, aluminum, copper, chromium, nickel, cobalt, silver or gold.

Without using acid or alkaline etching baths, the polymer material provided with the poromeric adhesive layer can be metallized chemically or physically according to known methods. A subsequent electrolytic reinforcement of the top metal coat, which may be of copper, for example, with additional copper or other metals is possible. The addition of luster formers to the bath yields smooth surfaces.

The adhesive strength of the poromeric adhesive layers produced according to the method of the invention on the polymer material, for example, polyethylene terephthalate, is for 6.5 mm. typically H 3 to 4 Newton but values of about H 5 Newton/6.5 mm. are also obtained. The adhesive strength of a copper coating of a thickness of 110 nm. on the poromeric adhesive layer is between H 3 and H 4 Newton/6.5 mm.

The adhesive strength is measured by a conventional test involving removing a pressed-on adhesive foil. The test is described in "Adhasion" 1969/9, pp. 335–342; the rate of travel of the power actuated grip 250 mm/min.

The adhesive strengths of the top metal coating on the polymer material achieved by the method of the invention are on the average above those which are achieved by the conventional methods. This unexpected advantageous result is due primarily to the fact that the deposited metal can anchor itself essentially mechanically in the micropores of the poromeric adhesive layer, which is comparable to the press fastener mechanism in ABS polymers, and is thus secured to the polymer material by means in addition to the intermolecular forces.

Of particular technical importance is the fact that the many elaborate etching methods which reduce the quality of the polymer material, particularly when the body of the material has a large surface to volume ratio, can be eliminated in the method of the invention.

By varying the parameters of the method, such as the type and concentration of the polymer in the polymeric coating solution, composition of the solvent mixture, temperature and humidity of the air, the microporosity of the poromeric adhesive layers can be varied within wide limits, and the invention can thus be used in a wide range of applications, for example, for the production of thin metal layer bands which can be used in the storage battery art or metallized polymer bodies of different shapes for decorative purposes, depending on the required final properties. Another advantage of the invention is that the formation of the poromeric adhesive layer can be effected either intermittently or continuously; for example, with continuous coating it is possible to produce endless bands.

The following examples further illustrate the invention.

EXAMPLE 1

A polyethylene terephthalate band 36 microns thick is coated on both sides by being dipped into a 10%, by weight, solution of a polyurethane in a solvent mixture consisting of 78%, by volume, dimethyl formamide and 22%, by volume, acetone. The polyurethane is produced from an adipic acid/diethylene glycol polyester having a molecular weight of 2200 and diphenylmethane-4,4'-diisocyanate in dimethyl formamide as a reaction medium, from which a prepolymer is formed to which prepolymer diaminodiphenylmethane is added as a chain extender. The band, after being coated, is passed through a drying duct, into which is introduced an air current having a relative humidity of 85% and a temperature of 26° to 30° C. In order to fix the partly coagulated polymeric coating material and thus to increase the formation of the poromeric gel structure, all the solvent is removed from the band at temperatures below 50° C. by washing with water. A final drying at temperatures above 50° C. yields a nontacky opaque polyethylene terephthalate band coated with a poromeric adhesive layer. The adhesive strength of the poromeric adhesive layer on the carrier material is between H 2.8 and H 3.5 Newton/6.5 mm.

For the metallization the band is sensitized with tin (II) chloride solution, activated with aqueous palladium chloride solution, and subsequently copper plated without current. The adhesive strength of the copper coating is approximately H 3.5 Newton/6.5 mm., with a coating thickness of the copper of 110 nm. The copper coating is reinforced by galvanic means and luster formers are added to the bath to give a particularly smooth surface.

EXAMPLE 2

Similarly to Example 1, a polyethylene terephthalate band of 36 $\mu$m thickness is coated on both sides with a 20% solution of a low molecular weight polyethylene terephthalate (molecular weight less than 50,000) in dimethyl formamide/acetone (1:1 by volume). The coagulation is effected by means of an air current of 30° C. and 65% relative humidity (calculated at normal atmospheric pressure). After washing with water under 50° C. to remove solvent residues and drying in an air current above 50° C., an opaque poromer-coated carrier band having a non-tacky surface is obtained. The adhesive strength of the poromeric adhesive layer on the polyethylene terephthalate band is above H 3 Newton/6.5 mm., that is, at this value the pressed-on adhesive foil is detached without any separation of the poromeric layer from the carrier material. This prepared material, without acid or alkaline, etching, can be copper plated without current and with pre-treating as described in Example 1. The adhesion of the copper coat is between H 3.1 and 3.5 Newton/6.5 mm. A further electrolytic reinforcement of the copper coat with copper or other metals is possible.

EXAMPLE 3

As described in Example 1, a polyethylene terephthalate band 36 microns thick is coated on both sides with a 5%, by weight, solution of polyvinylformal (molecular weight about 100,000) in dimethyl formamide. After coagulation with air of 90% relative humidity (calculated at normal atmospheric pressure), washing with water and drying, an opaque, nontacky poromer-coated band is obtained. The adhesive strengh of the poromeric adhesive layer on the carrier band is H 3.9 to 5 Newton/6.5 mm., that of the copper coat, deposited without current as in Example 1, is H 3.2 to H 4.1 Newton/6.5 mm. Subsequent electrolytic reinforcement with additional copper or other metals is possible.

EXAMPLE 4

Production of the polyurethane dispersion

To 72.3 g. of a 35%, by weight, solution in dichloroethane of a polyurethane having terminal OH groups (OH number 35, molecular weight 3200) is added 140 g. dimethyl formamide. To this solution is added with stirring 7.7 g. of a 75%, by weight, solution of a commercial urethane polymer (isocyanate equivalent weight 324) based on toluylene diisocyanate and trimethylol propane. By adding 44 g. of a 30%, by weight, solution of a low molecular weight polyethylene terephthalate (OH number about 5, molecular weight less than 50,000) in dimethyl formamide, a dispersion of the polyurethane is formed.

Coating the carrier material

A polyethylene terephthalate band of 36 microns thickness is coated on both sides by being dipped into a 17%, by weight, polyurethane dispersion in a mixture dichloroethane and dimethyl formamide, produced as described above. The coagulating is effected by conducting the band through a duct into which an air current of 23° to 30° C. and a relative humidity of 50% is introduced. After washing the pretreated band with water at a temperature below 50° C. to remove all solvent residues, and subsequent drying, an opaque, poromer-coated polyethylene terephthalate band having a non-tacky surface is obtained. The adhesive strength of the poromer layer on the carrier material is above H 4 Newton/9 mm.

For the metallization, the band is sensitized with tin (II) chloride solution, activated with aqueous palladium chloride solution, and subsequently copper plated non-galvanically. The adhesive strength of the chemically applied copper coat is above H 2.5 Newton/9 mm. The reinforcement of the copper coat is effected galvanically. The addition of luster formers to the baths results in a smoother surface.

EXAMPLE 5

A plate of 3 mm. thickness of commercial polycarbonate is coated on one side by brushing with a 15%, by weight, solution of a polyurethane in a solvent mixture consisting of dimethyl formamide and acetone (3:1, by volume). The production of the polyurethane is effected as described in Example 1. After the coagulation of the polyurethane coating at 25° to 30° C. and a relative humidity of 95% (calculated at normal atmospheric pressure), washing to remove the solvent, and drying, a non-tacky, opaque polycarbonate plate having a poromer layer is obtained. The adhesive strength of the poromer layer on the carrier material is above H 4 Newton/9 mm., that is, when a pressed-on adhesive foil is removed, the poromer layer is not removed from the carrier material at H 4 Newton.

The non-galvanic metallization of the plate is carried out as in Example 1. The adhesive strength of the copper coat is about H 4 Newton/9 mm.

EXAMPLE 6

A plate of a commercial polymethylmethacrylate of 3 mm. thickness is coated on one side, as described in Example 5, with a 15%, by weight, solution of a polyurethane by brushing. After the coagulation of the polyurethane coat at 25° to 30° C. and a relative humidity of 95% (calculated at atmospheric pressure), washing to remove the solvent and drying, a non-tacky opaque poromer-coated polymethylmethacrylate plate is obtained. The adhesive strength of the poromer layer on the carrier material is about H 5 Newton/9 mm; that is, when a pressed-on adhesive foil is removed, the poromer layer is not detached from the carrier material at H 5 Newton.

The non-galvanic metallization of the plate is effected as described in Example 1. The adhesive strength of a copper coat is about H 4.5 Newton/9 mm.

EXAMPLE 7

A plate of 3 mm. thickness, made of commercial polyurethane by injection molding, is coated on one side, as described in Example 5, by brushing with a 15% solution of a polyurethane. After the coagulation of the polyurethane coat at 25° to 30° C. and a relative humidity of 95% (calculated at atmospheric pressure), washing to remove the solvent and drying, a non-tacky, opaque, poromer-coated polyurethane plate is obtained. The adhesive strength of the poromer layer on the carrier material is between H 4.5 and H 5.5 Newton/9 mm.

The non-galvanic metallization of the plate is effected as in Example 1. The adhesive strength of the copper coat is about H 4.5 Newton/9 mm.

EXAMPLE 8

A polyquinoxaline foil of 100 7μm thickness is coated on one side, as described in Example 5, by brushing with a 15% solution of a polyurethane. After the coagulation of the polyurethane coat at 25° to 30° C. and a relative humidity of 95% (calculated at atmospheric pressure), washing to remove the solvent and drying, a non-tacky opaque poromer-coated polyquinoxaline foil is obtained. The adhesive strength of the poromer layer on the carrier material is above H 5 Newton/9 mm., that is, when a pressed-on adhesive foil is removed, the poromer layer is not detached from the carrier material at H 5 Newton.

Currentless metallization of the plate is effected as described in Example 1. The adhesive strength of the copper coat is about H 4.5 Newton/9 mm.

What is claimed is:

1. A metallized article consisting essentially of a polymeric substrate, a non-tacky, milky, opaque poromeric polymer adhesive coating selected from the group consisting of polyurethane, polyethyleneterephthalate, and polyvinyl formal, said poromeric adhesive coating prepared by the method of depositing from a solution or dispersion thereof, coagulating in an atmosphere above 40 percent humidity and at a temperature of about 23°–30° C, washing with water and subsequently drying at temperatures above 50° C, and a top metal coating securely bound thereto by means of said poromeric adhesive.

2. Article according to claim 1, in which the polymer of the substrate is a member of the group consisting of polyethylene terephthalate, polymethylmethacrylate, polyurethanes, polyamides, polyolefins, polycarbonates and polyquinoxaline.

3. Article according to claim 1, in which the metal coating is a metal of the group consisting of zinc, aluminum, copper, chromium, nickel, cobalt, silver and gold.

4. A method of producing the metallized polymeric article of claim 1, comprising applying to said polymeric substrate a solution or dispersion of said adhesive polymer, coagulating said adhesive polymer in an atmosphere having a relative humidity above 40 percent at normal atmospheric pressure and at a temperature of about 23° to 30° C to form a poromeric adhesive coating adapted to accept a metal layer within said pores, washing and subsequently drying at temperatures above 50° C said coagulated coating and depositing a metal coating onto said poromeric adhesive coating.

5. Method according to claim 4, in which said adhesive polymer composition is a solution of a polymer of the group consisting of polyurethanes, polyethylene terephthalate and polyvinyl formal in a solvent selected from the group consisting of dimethylformamide and mixtures of dimethylformamide and acetone.

6. Method according to claim 4, in which said adhesive polymer composition is a dispersion of a polymer of the group consisting of polyurethanes, polyethylene terephthalate and polyvinyl formal in a mixture of halogenated hydrocarbon and dimethyl formamide.

7. Method according to claim 4, in which the coagulated poromeric adhesive coating is washed with water at a temperature of below 50° C thereby to completely eliminate the solvent and fix the poromeric adhesive coating.

8. Method according to claim 4, in which said atmosphere has a relative humidity above 65%.

* * * * *

UNITED STATES PATENT OFFICE
CERTIFICATE OF CORRECTION

PATENT NO. : 4,005,238
DATED : January 25, 1977
INVENTOR(S) : Joachim Gaehde, Adolf Gesierich, Ingrid Loeschcke It is certified that error appears in the above-identified patent and that said Letters Patent are hereby corrected as shown below:

[75] Inventors: Joachim Gaehde; Adolf Gesierich; Ingrid Loeschcke, all of Berlin, German Democratic Republic

[73] Assignee: Akademie der Wissenschaften der DDR, Berlin-Adlershof, German Democratic Republic

DELETE:

[30] Foreign Application Priority Data

October 25, 1973   German Democratic Republic
174378

Signed and Sealed this

Third Day of April 1979

[SEAL]

Attest:

RUTH C. MASON
Attesting Officer

DONALD W. BANNER
Commissioner of Patents and Trademarks